United States Patent [19]

Contiero

[11] Patent Number: 4,757,032
[45] Date of Patent: Jul. 12, 1988

[54] METHOD FOR DMOS SEMICONDUCTOR DEVICE FABRICATION

[75] Inventor: Claudio Contiero, Buccinasco, Italy

[73] Assignee: SGS Thomson Microelectronics S.p.A., Italy

[21] Appl. No.: 773,318

[22] Filed: Sep. 6, 1985

[30] Foreign Application Priority Data

Oct. 25, 1984 [IT] Italy ................. 23302 A/84

[51] Int. Cl.$^4$ ........................ H01L 21/225
[52] U.S. Cl. ..................... 437/162; 437/968; 437/41; 437/160; 437/980; 437/150
[58] Field of Search .............. 29/571, 578, 582; 148/187, 188; 357/23.1, 23.4, 41, 43; 148/DIG. 122, DIG. 123; 437/162, 160, 968, 980, 41, 149, 150

[56] References Cited

U.S. PATENT DOCUMENTS

| | | | |
|---|---|---|---|
| 4,274,892 | 6/1981 | Templin | 148/188 |
| 4,296,426 | 10/1981 | Gilles | 357/23 |
| 4,344,081 | 8/1982 | Pao et al. | 357/43 |
| 4,345,265 | 8/1982 | Blanchard | 357/23 |
| 4,402,003 | 8/1983 | Blanchard | 357/43 |
| 4,471,524 | 9/1984 | Kinsbron et al. | 29/571 |
| 4,472,212 | 9/1984 | Kinsbron | 148/188 |
| 4,546,535 | 10/1985 | Shepard | 29/571 |
| 4,569,123 | 2/1986 | Ishii et al. | 29/578 |
| 4,653,173 | 3/1987 | Chen | 437/162 |

OTHER PUBLICATIONS

Fong et al., "Power DMOS for High Frequency ... ", IEEE Trans. Electron Devices, vol. ED-27, No. 2, Feb. 1980, pp. 322-325.
Middelhoek, J. et al., "Polycrystalline Silicon as a Diffusion Source", IEEE J. of Solid-State Circuits, vol. SC-12, No. 2, Apr. 1977; pp. 135-138.
Ghandhi, S. K., "VLSI Fabrication Principles", John Wiley & Sons, 1983, pp. 588-595.
Kemlage et al., "Open Tube Diffusions", IBM Technical Disclosure Bulletin, vol. 13, No. 4, Sep. 1970, p. 911.

Primary Examiner—Brian E. Hearn
Assistant Examiner—T. N. Quach
Attorney, Agent, or Firm—Harry M. Weiss & Associates

[57] ABSTRACT

An improved method for the fabrication of a DMOS transistor. The method comprises forming the source region of the transistor by introducing doping from a doped, thin polycrystalline layer. A thin insulating layer is used to protect the body channel contact region from the source doping, and the thin polycrystalline layer is completely consumed and converted into an insulator by oxidation subsequent to the source doping step.

4 Claims, 2 Drawing Sheets

METHOD FOR DMOS SEMICONDUCTOR DEVICE FABRICATION

BACKGROUND OF THE INVENTION

1. Field of the Invention

This invention relates generally to an improved method for fabricating double-diffused MOS (DMOS) transistors and, more particularly, to an improved method of fabricating DMOS power transistors that can be used either in a discrete or an integrated structure or format.

2. Description of the Prior Art

In the past, DMOS transistors have been utilized either as discrete power transistors or as components in monolithic integrated circuits. DMOS transistors are inherently conservative of semiconductor ("real estate") substrate area because of the manner in which they are fabricated in a self-aligned fabrication sequence.

A channel body region was usually first formed by dopant introduction of one type dopant (P or N impurities) through an aperture in a mask of gate-forming material to provide a channel region which was self-aligned with the gate. Then a source region was usually formed by dopant introduction of a type opposite to that of the channel body region through the existing aperture so that the source was self-aligned to both the gate electrode and the channel body region. This permitted a very compact structure that utilized very little semiconductor "real estate."

However, in most applications of the DMOS device, particularly for power devices, it is necessary to form a very low-resistance electrical short between the channel body region and the source region to prevent undesired parasitic transistor action that might occur without shorting the body region to the source region. Because the channel body region is lightly doped, and because a low resistance electrical contact to a semiconductor region typically requires a heavily-doped surface region, it is necessary to provide an auxiliary heavily doped contact region for the channel body region to insure a good electrical contact to both the source and body regions. Such a heavily doped body region usually could not be self-aligned and hence there was an increase in the overall size of the DMOS device. Typically, the heavily doped body contact region was usually formed before the other two regions. Then a rather thick masking oxide patterned layer was used to protect the heavily doped body contact region against the source region dopant introduction step. The necessity to etch away or remove this masking oxide patterned layer together with any oxide over the source regions without disturbing the insulator over and/or under the gate electrode increased costs, tolerances, and process complexity and, as a result, decreased the yields of electrically good devices.

While various processes have been utilized in an attempt to ameliorate the foregoing problem, a need existed to provide an improved DMOS fabrication method and process sequence which allows an effective source to channel body electrical short without decreasing yield and which permits or is susceptible to device dimensional reduction.

SUMMARY OF THE INVENTION

In accordance with one embodiment of this invention, it is an object of this invention to provide an improved process for the fabrication of a DMOS transistor.

It is another object of this invention to provide an improved fabrication method or process sequence for a DMOS transistor which results in a smaller device and a higher yield of good devices.

It is still another object of this invention to provide an improved DMOS fabrication method or process sequence which facilitates the provision of an electrical short between the body channel region and the source regions of the DMOS transistor.

It is yet another object of this invention to provide an improved method for fabricating power DMOS transistors.

It is still a further object of this invention to provide an improved process for fabricating DMOS transistors in integrated circuits.

BRIEF DESCRIPTION OF THE PREFERRED EMBODIMENT

In accordance with a preferred embodiment of this invention, a method for the fabrication of a DMOS transistor is disclosed wherein the DMOS transistor comprises a body channel region and at least one source region located in a substrate. The method comprising doping and forming the source regions of the DMOS transistor from a doped polycrystalline layer deposited on the substrate. The source regions of the DMOS transistor are formed by, for example, an arsenic doped polycrystalline silicon layer which is then thermally oxidized to leave a thin oxide over the source regions of the DMOS transistor device. By using the polycrystalline layer as a doping source, only a very thin oxide is required to mask protect the body channel contact region from the effects of the source region doping and drive in diffusion step. The thin oxide remaining over both the source regions and the body channel contact region is removed in a metal deposition operation to electrically short together the source regions and the body channel contact region without impairing the integrity of the insulator over or under the gate electrode and without the need or use of large tolerances for the formation of the various regions.

In accordance with another embodiment of this invention, a method is disclosed for the fabrication of a DMOS transistor in a semiconductor substrate. The DMOS transistor comprising a body channel region, a body channel contact region, at least one source region, a gate electrode, and a gate insulator. The fabrication method comprises the steps of forming the body channel contact region, forming the body channel region, protecting at least a portion of the body channel region with an insulator, depositing a thin layer of doped polycrystalline silicone to contact at least a portion of the body channel contact region that is unprotected by the insulator, and forming the source region by doping from the doped polycrystalline silicon.

The foregoing and other objects, features, and advantages of the invention will be apparent from the following, more particular description of the preferred embodiments of the invention, as illustrated in the accompanying drawing.

DETAILED DESCRIPTION OF THE INVENTION

Figure 1A:
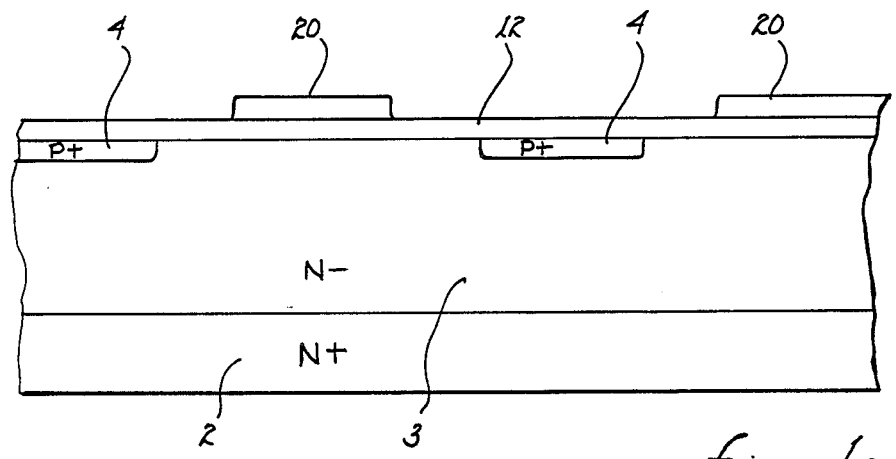
FIGS. 1a, b, c, d, e and f depict cross-sectional views of the DMOS device of this invention at six different stages of the fabrication process in order to illustrate the improved device and method of this invention.

Referring now to FIG. 1a, a cross-sectional view of a semiconductor substrate suitable for the fabrication of an improved DMOS transistor device according to the improved method of the present invention is shown. An epitaxial layer 3 of N-type material deposited on a heavily-doped N+ substrate 2 is illustrative of a starting point of the improved process. Alternatively, the N-region 3 could be an isolated (PN junction isolated or dielectric isolated) tub region in an integrated circuit substrate according to well-known conventional isolation type processes. At least one (and preferably two or more) P+ regions 4 are formed in the surface of the N-type region 3 by, for example, conventional photolithographic masking, etching and diffusion techniques using a P type dopant source such as Boron. If desired, ion implantation techniques can be used to form the P+ regions 4 and the number of the P+ regions 4 would depend on whether a discrete DMOS device was being formed or whether one or more DMOS devices were being used in an integrated circuit configuration. The one or more so formed surface regions 4 of heavily-doped P+ type semiconductor material will eventually form the high conductivity or low resistivity contact regions for the body channel of the completed DMOS device. Then a layer 12 of oxide (silicon dioxide) is preferably thermally grown or deposited over the surface of the substrate including over the substrate surface containing the one or more P+ regions 4. This oxide will preferably and subsequently serve as the gate insulator of the completed DMOS device. Then a layer of, for example, 5,000 Angstroms of polycrystalline silicon is deposited on the insulating layer 12 and patterned, preferably by conventional photolithographic masking and etching techniques, leaving one or more conductive gate electrode regions 20 with each gate electrode region 20 serving as the gate electrode for a completed DMOS device. The polycrystalline silicon is preferably doped with, for example, phosphorous during the polycrystalline silicon deposition step in order to render it electrically conductive and thereby provide the one or more gate electrodes 20. The insulating layer 12 typically has a thickness in the range of 50 to 150 nanometers and preferably has a thickness of about 850 Angstroms.

Figure 1B:
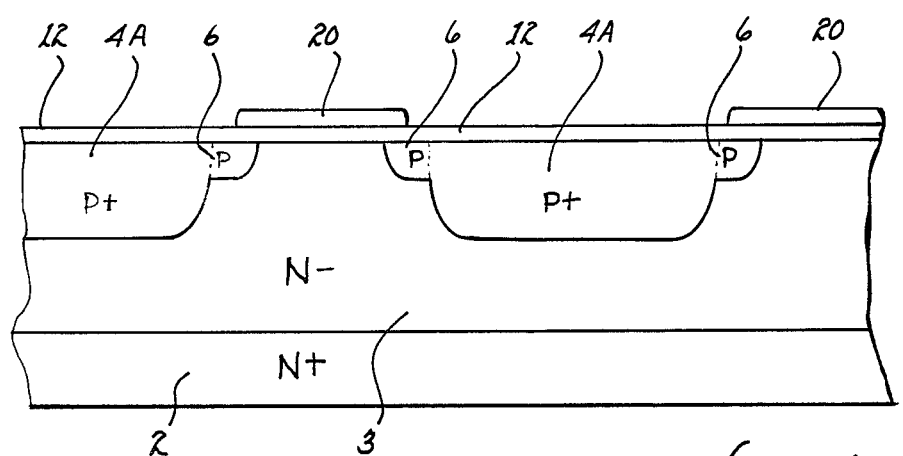

Referring next to FIG. 1b, an additional P type doping is introduced through the apertures formed by the doped polysilicon regions 20. A suitable P type dopant, such as boron, is most conveniently and accurately introduced by ion implantation through the thin insulating layer 12. The doping thus introduced along with the doping in the heavy P+ type regions 4 previously introduced are then driven into the substrate at high temperature in order to form P type body channel regions 6 and the much higher P+ doped channel body contact regions 4A, respectively. Because of lateral diffusion during the drive in diffusion operation, it should be noted that the more lightly doped P regions 6 extend outwardly (under the oxide portion that is under the doped polysilicon gate electrode 20) beyond the more heavily doped P+ regions thereby providing optimum channel regions for the N channel DMOS device that is formed by the process of this invention.

Figure 1C:
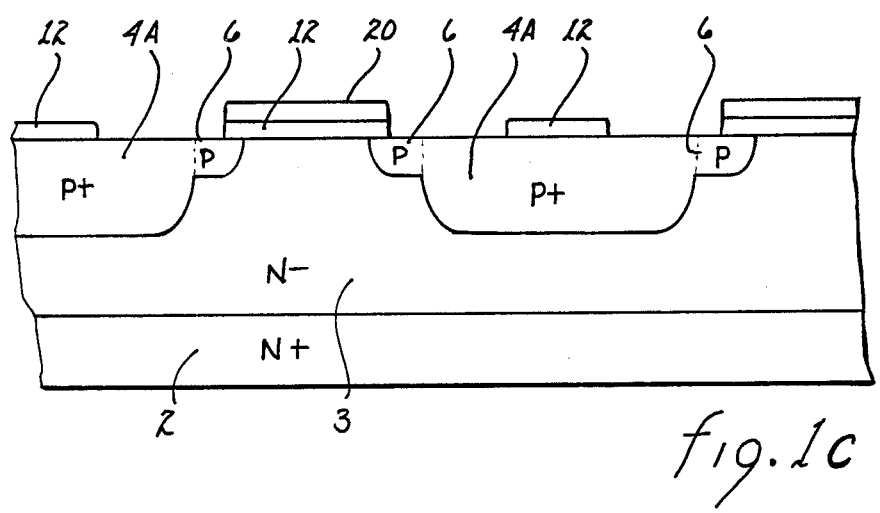

Proceeding now to FIG. 1c, portions of the gate insulating oxide layer 12 have been removed by conventional photolithographic masking and etching techniques to expose portions of the P type regions 4A and 6. The portions of the insulating layer 12 remaining over the P+ body channel contact regions 4A serve to mask or protect these regions from the subsequent doping step depicted in the following FIGS. 1d and 1e.

Figure 1D:
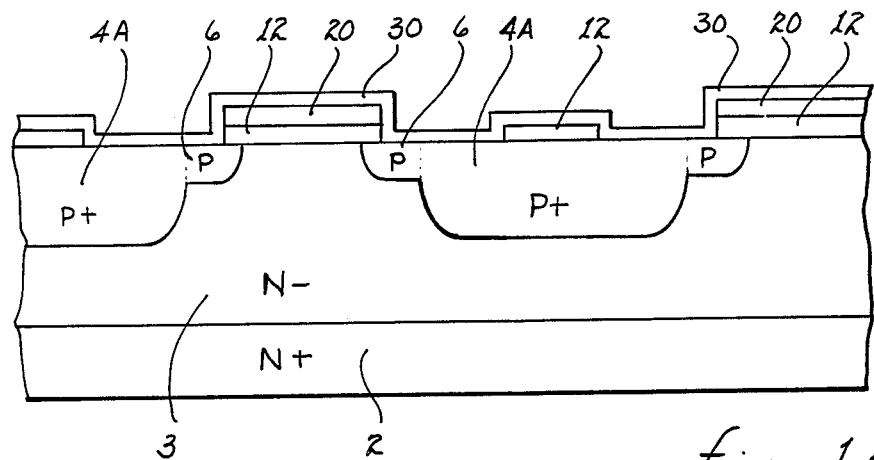

Referring now to FIG. 1d, a thin layer of polycrystalline silicon 30 has been deposited over all portions of the surface of the semiconductor substrate. The thickness of this thin polycrystalline silicon film is preferably about 30 nanometers or 300 Angstroms, and it is doped with an N type impurity such as, preferably, arsenic during the polycrystalline silicon deposition step. Arsenic is a preferred N type dopant because it will produce shallower N+ source regions 8 because of its slower diffusion rate than, for example, phosphorous and will also permit the use of a thin masking oxide for the formation of the arsenic doped N+ source regions 8.

Figure 1E:
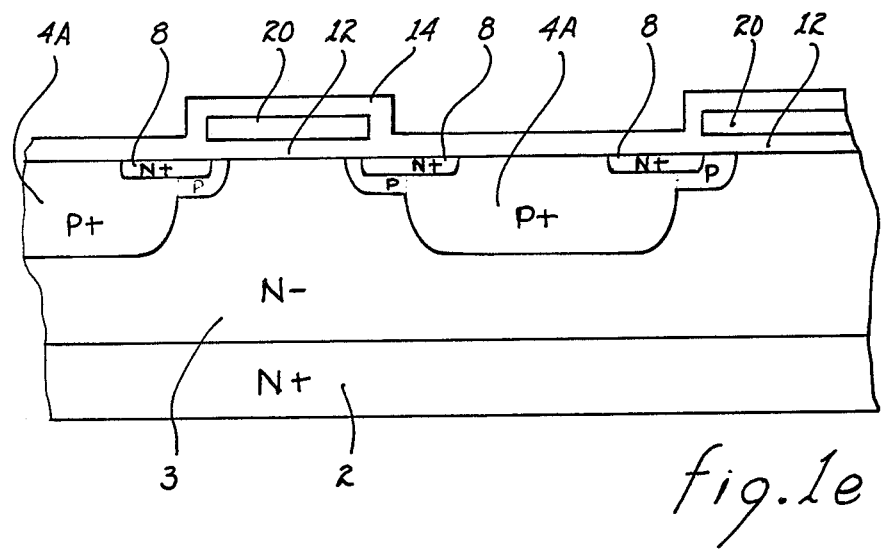

The N type dopant serves to provide the N+ source regions 8 as shown in FIG. 1e after exposure to high temperature during a diffusion drive-in cycle. During the course of this diffusion drive-in heat treatment, the arsenic in the arsenic doped, thin polycrystalline silicon film or layer 30 is transferred or conveyed into the N+ source region 8. An oxidizing operation is carried out or introduced during this drive-in diffusion step to convert the polysilicon layer 30 to an insulator layer 14 of oxide (silicon dioxide) covering all the conductive or semiconductor regions of the device including the gate electrodes or regions 20. Thus, not only have the heavily-doped N+ source regions 8 been formed, but these N+ regions 8 and the P+ body channel contact regions 4A are both overlain with nearly the same thickness of the thin thermal oxide insulator layer 14 over the N+ regions 8 and the P+ regions 4A which facilitates the subsequent contact opening for metal contact deposition and formation.

Figure 1F:
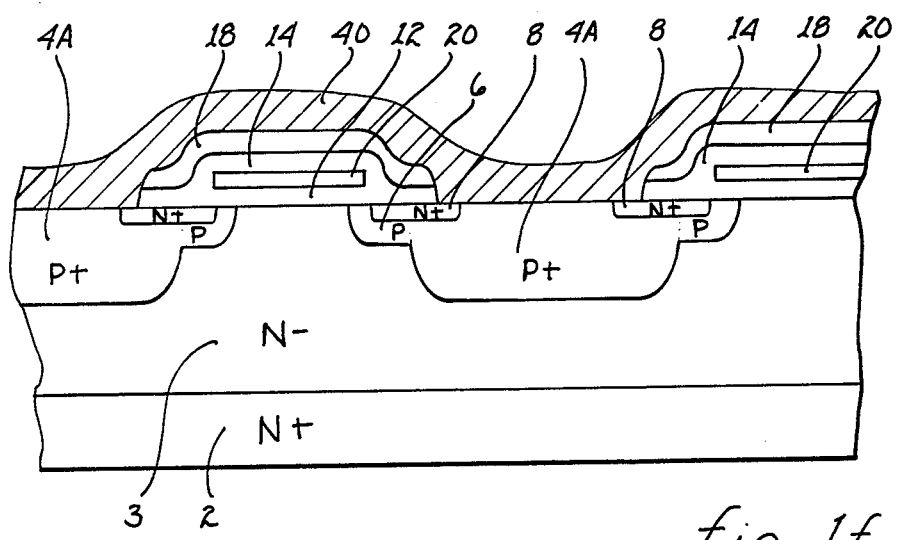

Referring now to FIG. 1f, a layer 18 of deposited (and patterned by photolithographic masking and etching techniques) oxide (preferably, a phosphorous doped vapox) is used to augment the thin thermally grown oxide layer 14 in order to more completely insulate and protect the gate eletrode regions 20. This layer 18 of deposited oxide is preferably lightly-doped with phosphorus in order to enhance its insulating and passivating functions. Apertures have been formed, etched or cut through both of the oxide layers 14 and 18 to expose portions of the N+ source regions 8 and the P+ body channel contact regions 4A at the surface of the semiconductor substrate. Then, a layer 40 of a suitable, electrically conductive material such as aluminum or an aluminum alloy is deposited over the entire structure and patterned (not shown) to delineate individual DMOS devices for an integrated circuit application. This conductive layer serves to make electrical contact to the N+ source regions 8 of the DMOS device as well as to provide a desirably low resistance, electrical shorting contact between the heavily doped N+ source regions 8 and the heavily doped P+ body channel contact region 4A. The N-region 3 together with the underlying N+ region 2 provide the drain regions for the DMOS device and an electrical contact to the N-region 3 (not shown) is either provided by providing an ohmic contact to a surface portion of this N-region 3 or, if the DMOS device is used as a discrete DMOS power device, by providing an ohmic electrical contact to the backside of the N+ region 2.

While the invention has been particularly shown and described with reference to preferred embodiments thereof, it will be understood by those skilled in the art that the foregoing and other changes in form and detail may be made without departing from the spirit and scope of the invention. For example, the conductivity types shown in the preferred embodiment may be reversed thus providing a P channel DMOS device. The starting point is a substrate or substrate portion of a first conductivity type, followed by the introduction of body channel and body channel contact regions of a second conductivity type opposite to the first conductivity type, and culminated by the introduction of source regions of the first conductivity type from a doped polycrystalline silicon source (doped with impurities of said first conductivity type) which is subsequently oxidized.

What is claimed is:

1. A method for the fabrication of a DMOS transistor in a semiconductor substrate, said DMOS transistor comprising a body channel region, a body channel contact region, a source region, a gate insulating layer, and a gate electrode, comprising the steps of:

forming said body channel contact region in said semiconductor substrate;

forming said gate insulating layer directly over the entirety of said body channel contact region;

forming said gate electrode by patterning a layer of polycrystalline silicon deposited on said gate insulator;

forming said channel body region;

removing a portion of said gate insulating layer from said substrate including a portion of said channel body contact region;

forming a thin layer of arsenic-doped polycrystalline silicon over said substrate, said thin layer of arsenic doped polycrystalline silicon being in contact with said body channel region and said body channel contact region; and diffusing from said thin layer of arsenic doped polycrystalline silicon to form said source region in said substrate where only said gate insulating layer masks said body contact region from said diffusing step.

2. The method according to claim 1, where the steps are performed in the order recited.

3. The method according to either claim 1 or claim 2, where said step of forming said thin layer of arsenic doped polycrystalline silicon includes forming a portion of said thin layer directly over said gate insulating layer.

4. The method according to either claim 1 or claim 2, further including the steps of completely oxidizing said thin layer of arsenic doped polycrystalline silicon to form an insulating and protective layer over said gate electrode, and then depositing electrically conductive material over said insulating and protective layer for contacting said source region.

* * * * *